US008343807B2

(12) United States Patent
Aksyuk et al.

(10) Patent No.: US 8,343,807 B2
(45) Date of Patent: Jan. 1, 2013

(54) PROCESS FOR MAKING MICROELECTRONIC ELEMENT CHIPS

(75) Inventors: Vladimir Anatolyevich Aksyuk, Westfield, NJ (US); Nagesh R Basavanhally, Skillman, NJ (US); Avinoam Kornblit, Highland Park, NJ (US); Warren Yiu-Cho Lai, Chatham Township, NJ (US); Joseph Ashley Taylor, Springfield, NJ (US); Robert Francis Fullowan, Berkeley Heights, NJ (US)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 12/291,974

(22) Filed: Nov. 17, 2008

(65) Prior Publication Data
US 2009/0075424 A1 Mar. 19, 2009

Related U.S. Application Data

(62) Division of application No. 11/445,072, filed on May 31, 2006, now Pat. No. 7,474,005.

(51) Int. Cl.
*H01L 31/0224* (2006.01)
*H01L 23/535* (2006.01)

(52) U.S. Cl. . 438/118; 438/459; 438/667; 257/E21.511; 257/E21.597; 257/E23.067; 257/E23.011

(58) Field of Classification Search ............... 438/118, 438/459, 667; 257/E21.511, E21.597, E23.067, 257/E23.011
See application file for complete search history.

(56) References Cited

U.S. PATENT DOCUMENTS
5,319,237 A 6/1994 Legros
(Continued)

FOREIGN PATENT DOCUMENTS
DE 198 38 439 C1 4/2000
(Continued)

OTHER PUBLICATIONS
May 2006, Broennimann et al., "Development of an Indium Bump Bond Process for Silicon Pixel Detectors at PSI", Preprint submitted to Elsevier Science, pp. 1-8.

(Continued)

*Primary Examiner* — George Fourson, III
(74) *Attorney, Agent, or Firm* — Jay M. Brown

(57) ABSTRACT

Apparatus including a chip substrate having a first chip surface facing away from a second chip surface; an array of microelectronic elements on the first chip surface; and an array of conductors each in communication with one of the microelectronic elements, the conductors passing through the chip substrate and fully spanning a distance between the first and second chip surfaces. Process including: providing an apparatus including a chip substrate having a first chip surface facing away from a second chip surface, an array of microelectronic elements being on the first chip surface, an array of conductors each being in communication with one of the microelectronic elements and partially spanning an average distance between the first and second chip surfaces; bonding a temporary support carrier onto the array of microelectronic elements; removing a portion of the chip substrate, thereby reducing the average distance between the first and second chip surfaces; and forming an under bump metallization pad at the second chip surface in electrical communication with a conductor.

22 Claims, 9 Drawing Sheets

U.S. PATENT DOCUMENTS

| | | | |
|---|---|---|---|
| 5,378,926 A | | 1/1995 | Chi et al. |
| 5,532,506 A | | 7/1996 | Tserng |
| 6,110,825 A | | 8/2000 | Mastromatteo et al. |
| 6,225,651 B1 | | 5/2001 | Billon |
| 6,239,495 B1 | | 5/2001 | Sakui et al. |
| 6,245,594 B1 | | 6/2001 | Wu et al. |
| 6,365,513 B1 | * | 4/2002 | Furukawa et al. ............ 438/667 |
| 6,379,982 B1 | | 4/2002 | Ahn et al. |
| 6,448,661 B1 | | 9/2002 | Kim et al. |
| 6,492,195 B2 | * | 12/2002 | Nakanishi et al. ............ 438/106 |
| 6,624,506 B2 | | 9/2003 | Sasaki et al. |
| 6,753,199 B2 | * | 6/2004 | Faska et al. ..................... 438/28 |
| 6,756,681 B1 | | 6/2004 | Hanawa |
| 6,791,739 B2 | | 9/2004 | Ramanujan et al. |
| 6,836,020 B2 | | 12/2004 | Cheng et al. |
| 6,841,469 B2 | | 1/2005 | Sawada et al. |
| 7,344,959 B1 | * | 3/2008 | Pogge et al. ................... 438/459 |
| 7,358,152 B2 | * | 4/2008 | Kub et al. ...................... 438/459 |
| 7,417,325 B2 | * | 8/2008 | Farnworth et al. ............ 257/780 |
| 7,566,657 B2 | * | 7/2009 | Kamins ........................ 438/667 |
| 2004/0009649 A1 | * | 1/2004 | Kub et al. ...................... 438/459 |
| 2004/0115919 A1 | * | 6/2004 | Takaoka ........................ 438/613 |
| 2004/0124513 A1 | | 7/2004 | Ho et al. |
| 2006/0214302 A1 | * | 9/2006 | Matsuo .......................... 257/758 |
| 2006/0220214 A1 | * | 10/2006 | Ando ............................. 257/690 |
| 2006/0223199 A1 | * | 10/2006 | Ando .................................. 438/3 |

FOREIGN PATENT DOCUMENTS

JP          H04-370958 A          12/1992

OTHER PUBLICATIONS

Unknown, Hendricks at al., "Back-side processing poses tough challenges for GaAs (Cover Story: Processing)" 7 pgs., printed on May 31, 2006 from http://compoundsemiconductor.net/articles/magazine/7/10/39/1.

2006, "Gimbal-less Two-Axis Scanning Micromirrors", Adriatic Research Institute, 2 pgs., 2006.

* cited by examiner

PROCESS FOR MAKING MICROELECTRONIC ELEMENT CHIPS

U.S. GOVERNMENT

The U.S. Government has a paid-up license in this invention and the right in limited circumstances to require the patent owner to license others on reasonable terms as provided for by the terms of U.S. Defense Advanced Research Projects Agency ("DARPA") CCIT Phase 2 contract No.: HR0011-04-C-0048.

BACKGROUND OF THE INVENTION

1. Field of the Invention

This invention relates generally to microelectronic element chips, and processes for their fabrication.

2. Related Art

Myriad microelectronic elements have been formed on conductive wafers such as silicon wafers. Multiple such devices may be formed on a single wafer, which then may be diced to separate the devices as chips. A single chip may contain a number of microelectronic elements integrated into a circuit.

As this vast chip technology continues to evolve, the potential magnitude of conductor interconnections between a chip and further circuitry with which the chip may be integrated accordingly continues to grow. Implementation of early chip technology included the practice of bonding wire conductor interconnections on top of microelectronic elements formed on the chip. With ever greater multiplicity of potential conductor interconnections with a chip, direct chip attachment ("DCA") technology has been developed, including provision of conductor interconnections that may pass through the chip itself from one side of the wafer to the other. However, the need for sufficient conductor interconnections for the large numbers of microelectronic elements that may be formed on a single chip constitutes a continuing problem, and a limitation in chip design.

There is a continuing need for new types of chip structures for direct chip attachment that may facilitate further growth in the potential magnitude of microelectronic elements to be formed on a chip, and a need for processes that facilitate the fabrication of such chip structures.

SUMMARY

In an implementation example, an apparatus is provided, including a chip substrate having a first chip surface facing away from a second chip surface; an array of microelectronic elements on the first chip surface; and an array of conductors each in communication with one of the microelectronic elements, the conductors passing through the chip substrate and fully spanning a distance between the first and second chip surfaces.

In another example, a process is provided, including: providing an apparatus including a chip substrate having a first chip surface facing away from a second chip surface, an array of microelectronic elements being on the first chip surface, an array of conductors each being in communication with one of the microelectronic elements and partially spanning an average distance between the first and second chip surfaces; bonding a temporary support carrier onto the array of microelectronic elements; removing a portion of the chip substrate, thereby reducing the average distance between the first and second chip surfaces; and forming an under bump metallization pad at the second chip surface in electrical communication with a conductor.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
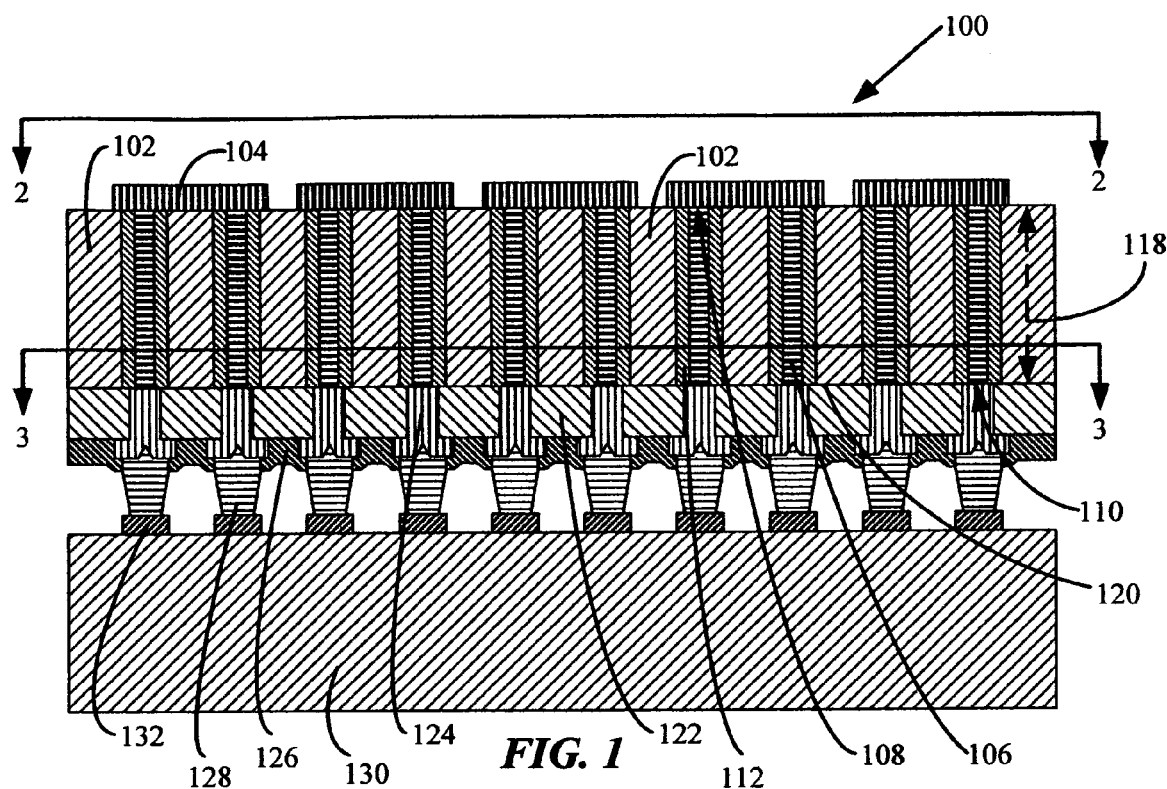
FIG. 1 is a cross-sectional view showing an implementation of an example of a microelectronic element array chip with direct chip attachment ("DCA") pads ("Microelectronic Element Array with DCA Pads").
Figure 2:
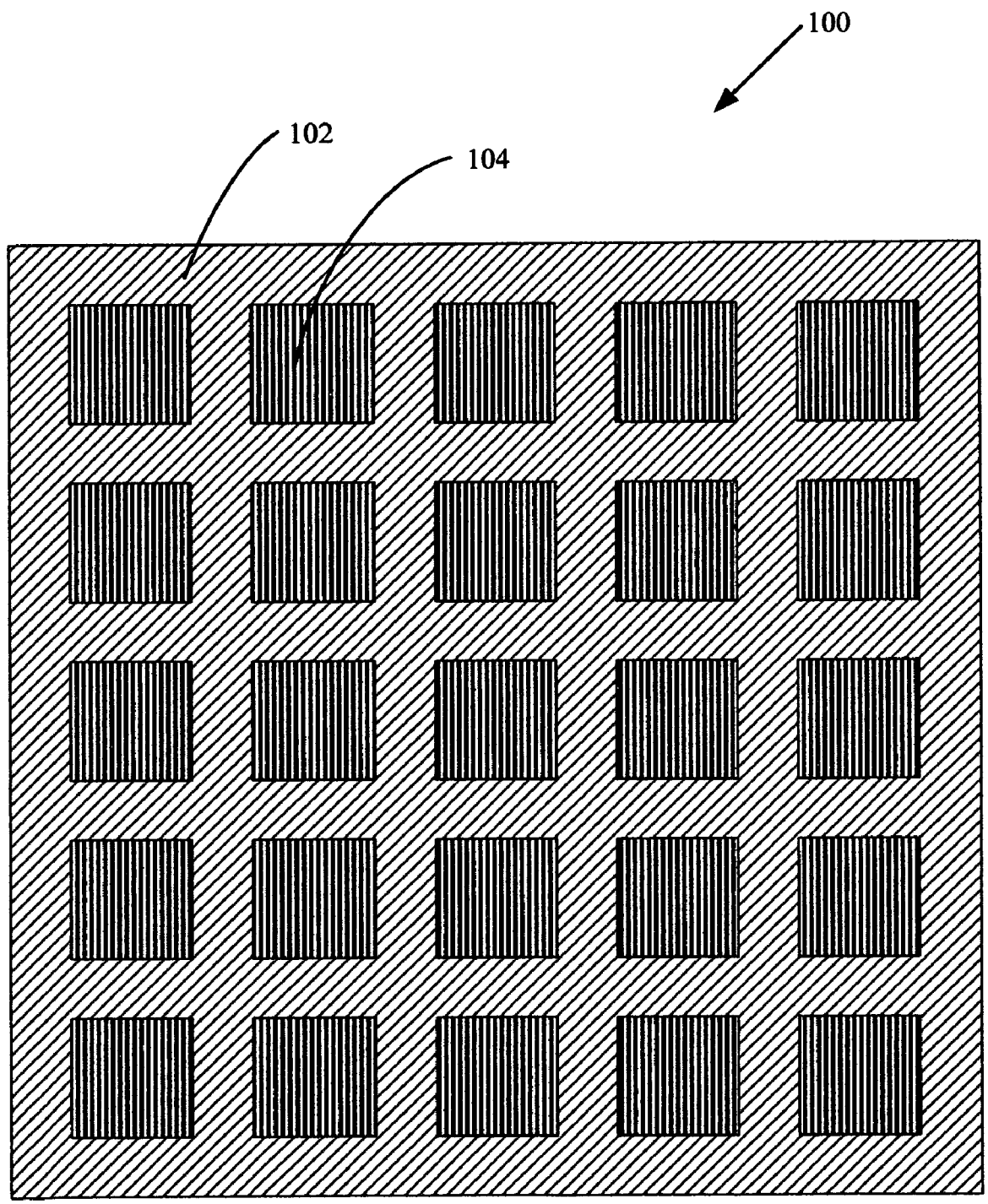
FIG. 2 is a top view, taken on line 2-2, of the Microelectronic Element Array with DCA Pads shown in FIG. 1.
Figure 3:
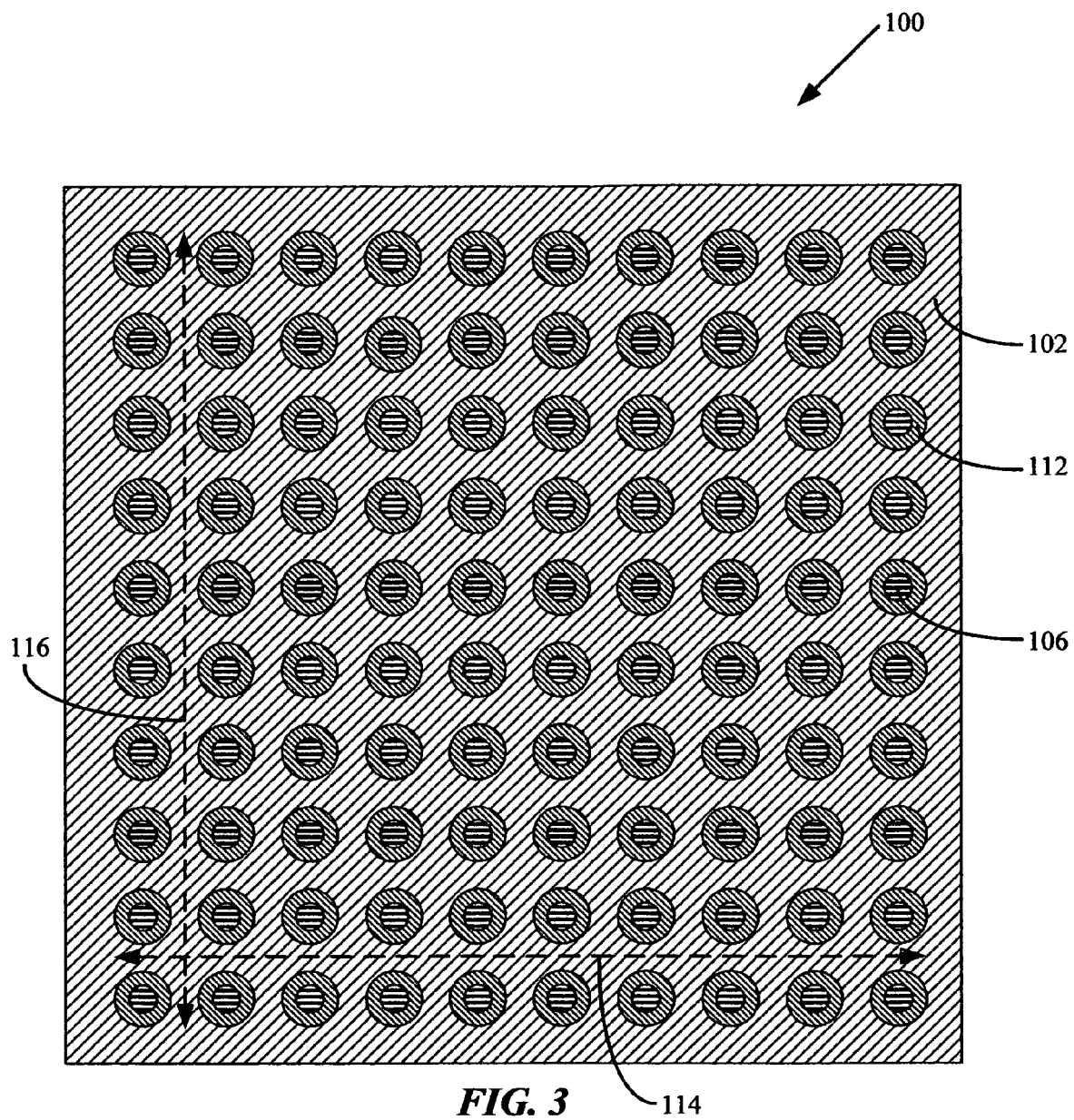
FIG. 3 is a cross-sectional view, taken on line 3-3, of the Microelectronic Element Array with DCA Pads as shown in FIG. 1.

FIG. 1 is a cross-sectional view showing an implementation of an example of a microelectronic element array chip with direct chip attachment ("DCA") pads ("Microelectronic Element Array with DCA Pads") 100. FIG. 2 is a top view, taken on line 2-2, of the Microelectronic Element Array with DCA Pads 100 shown in FIG. 1. FIG. 3 is a cross-sectional view, taken on line 3-3, of the Microelectronic Element Array with DCA Pads 100 as shown in FIG. 1.

The Microelectronic Element Array with DCA Pads 100 includes a chip substrate 102 on which an array of microelectronic elements 104 is formed. Throughout this specification, the term "microelectronic element" means a device including electrical conductors that affect the device in operation. The term "microelectronic element" includes, as an example, semiconductor devices, passive filters, sensors, and optoelectronic devices including micro-electro-mechanical systems ("MEMS"). The term "semiconductor device" means, throughout this specification, a device that utilizes a doped semiconductor p-n hetero-junction between Group 3-5, 2-6, or 4-4 semiconductors that allows a controlled flow of electrons and/or holes across the hetero-junction. As examples, "semiconductor devices" include transistors and diodes. The term "MEMS" means, throughout this specification, a device on a chip substrate 102 that integrates mechanical elements, actuators for the mechanical elements, and electronics for controlling the actuators. In an implementation, a MEMS device may include sensors. As a further example, a MEMS device may include optical elements, such as mirrors controlled by the actuators.

Throughout this specification, the term "array" means an arrangement of a plurality of microelectronic elements 104 on a chip substrate 102. As an example, the Microelectronic Element Array with DCA Pads 100 may include a five by five (5×5) array of twenty-five (25) microelectronic elements 104 on a chip substrate 102, arranged in five rows and five columns as shown in FIG. 2. It is understood that an "array" may include any number of microelectronic elements 104 arranged in any number of rows and columns, that the rows and columns may have equal or unequal spacing or lengths, that the rows and columns may or may not be mutually orthogonal, that such an array may incorporate one or more complex repeating patterns of relative locations for microelectronic elements 104 on a chip substrate 102, that an array may include individual microelectronic elements 104 or groups of such elements positioned at selected relative locations on a chip substrate, and that an array may include microelectronic elements randomly positioned on a chip substrate.

As an example, each microelectronic element 104 may include four element conductors 106 in communication with the microelectronic element and extending into the chip substrate 102 away from the microelectronic element. As an example, the microelectronic elements 104 may be MEMS micro-mirror elements. In this example, the four element conductors 106 in communication with each MEMS micro-mirror element may operate as controllers serving to power one or more actuators causing a micro-mirror in the MEMS micro-mirror element to be moved in a specified direction. It is understood that each microelectronic element 104 may include any selected number of element conductors 106, and that different microelectronic elements 104 in the Microelectronic Element Array with DCA Pads 100 may have different numbers of element conductors. It is further understood that by "element conductors 106 in communication with the microelectronic element" is meant that the element conductors 106 are placed in positions relative to the microelectronic element 104 that are suitable for its operation. As examples, the element conductors 106 may form an electrical connection with circuit elements within the microelectronic elements 104 or may generate an electromagnetic field affecting the microelectronic elements 104 depending on their structure and operating design.

The element conductors 106 extend from points 108 where they communicate with the microelectronic elements 104 to points 110 after passing through the chip substrate 102. As an example, the chip substrate 102 may be formed of a conductor such as polysilicon or a composition including silicon ("Si"). In this example, the element conductors may be surrounded by insulator layers 112.

FIG. 3 shows a ten by ten (10×10) array of element conductors 106 in an implementation of a five by five (5×5) array of microelectronic elements 104 that each may need four (4) element conductors for operation of the microelectronic elements. It is seen in FIG. 3 that as the magnitude of the array of microelectronic elements 104 to be formed on a chip substrate 102 is increased, and as the number of element conductors 106 needed for operation of each microelectronic element increases, the density and total number of element conductors needed for the Microelectronic Element Array with DCA Pads 100 may accordingly increase. As a further example, it is seen that as the dimensions of a Microelectronic Element Array with DCA Pads 100 increases, the number of element conductors 106 needed for the Microelectronic Element Array with DCA Pads 100 increases as a function of n×m, where n is the width and m is the height of the array represented by the arrows 114 and 116 respectively. The same increase as a function of n×m is seen with respect to the array of microelectronic elements 104 at the same density shown in FIG. 3. Meanwhile, the size of the perimeter of the chip substrate 102 increases only as a function of 2×n plus 2×m. Hence, as the size and density of the array are increased, the impracticality of wire bonding of element conductors on top of the microelectronic elements 104 and over the perimeter of the Microelectronic Element Array with DCA Pads 100, and the resulting need for DCA bonding, correspondingly increase.

Figure 4:
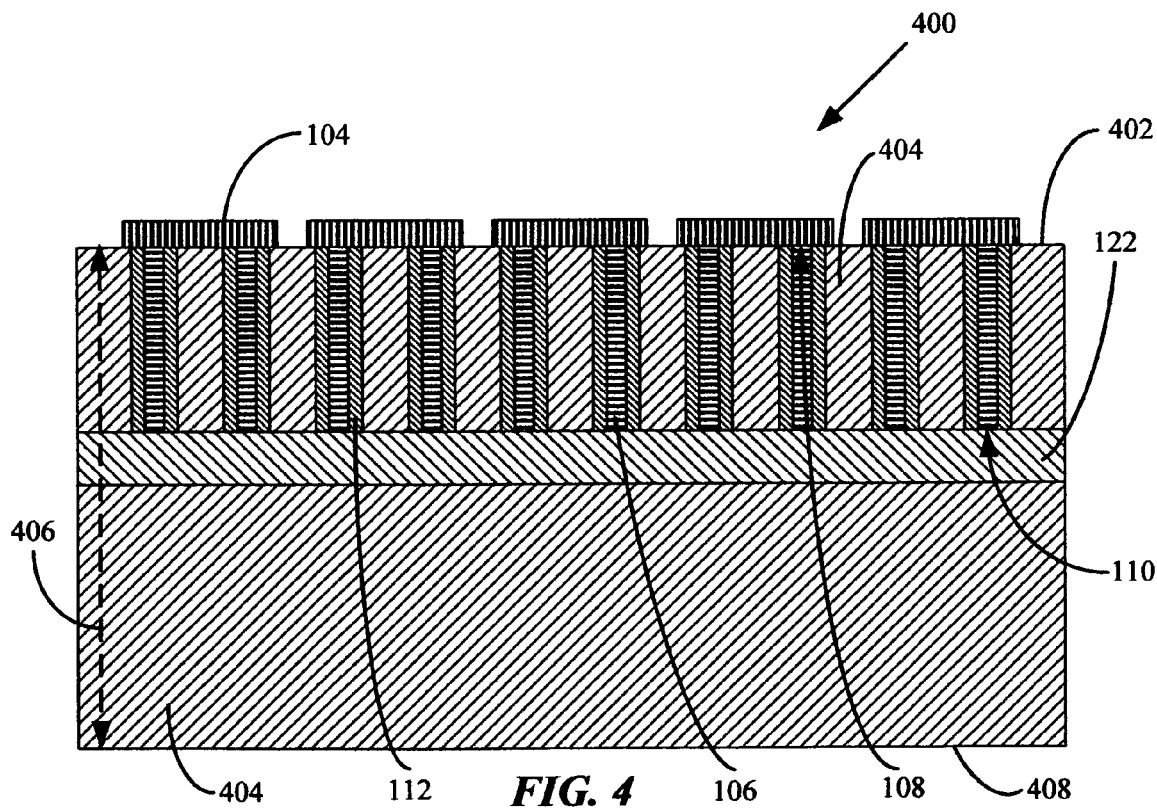
FIG. 4 is a cross-sectional view showing an array of microelectronic elements formed on a top surface of a typical chip substrate.

FIG. 4 is a cross-sectional view showing an array 400 of microelectronic elements 104 formed on a top surface 402 of a typical chip substrate 404. As an example, the thickness of a chip substrate 404 having a diameter of 200 millimeters, as represented by the arrow 406, may be about 725 micrometers plus or minus about 25 micrometers. Efforts to provide DCA pads for a microelectronic element 104 at a bottom surface 408 of a chip substrate 404 having a thickness of such a magnitude may be problematic. As an example, forming extensions of the element conductors 106 to reach the bottom surface 408 may be difficult, as attempting to fill an array of through wafer vias extending to the bottom surface 408 with a conductor may result in the formation of voids. Patterning of through wafer vias having high aspect ratios may accordingly be difficult. In an implementation, internal stresses in the chip substrate 404 may by generated by filling such an array of through wafer vias with a conductor, potentially causing distortion of the structure of the array 400 of microelectronic elements 104. Such distortion may complicate further fabrication steps or make completion of the array 400 unfeasible. As another example, forming extensions of the element conductors 106 having lengths adequate to traverse the thickness of the chip substrate 404 as represented by the arrow 406 may result in degraded performance of the array 400 of microelectronic elements 104 due to the high lengths of the element conductors.

Referring again to FIG. 1, the Microelectronic Element Array with DCA Pads 100 accordingly includes a chip substrate 102 having a substantially reduced average thickness, as represented by the arrow 118. As an example, the average thickness represented by the arrow 118 may be less than about 150 micrometers. In another implementation, the average thickness represented by the arrow 118 may be less than about 100 micrometers. The Microelectronic Element Array with DCA Pads 100 may be fabricated according to an implementation of a process discussed below that may be less susceptible to defective formation of extensions of the element conductors 106, the extension being formed onto a bottom surface 120 of the Microelectronic Element Array with DCA Pads 100. Furthermore, the Microelectronic Element Array with DCA Pads 100 may provide better performance in operation than the array 400 of microelectronic elements 104 formed on a typical chip substrate 404. Since the average thickness represented by the arrow 118 is substantially less than the thickness represented by the arrow 406, the element conductors 106 in the Microelectronic Element Array with DCA Pads 100 have a substantially shorter path length to the bottom surface 120 than do the element conductors 106 in the array 400 of microelectronic elements 104 to the bottom surface 408. The thickness of the chip substrate 102 represented by the arrow 118 may be inadequate to mechanically support the Microelectronic Element Array with DCA Pads 100. The example process for fabricating the Microelectronic Element Array with DCA Pads 100 discussed below may facilitate fabrication and DCA bonding of the Microelectronic Element Array with DCA Pads 100 without breakage or other damage to the Microelectronic Element Array with DCA Pads 100 otherwise potentially caused by the reduced thickness of the chip substrate 102.

The Microelectronic Element Array with DCA Pads 100 may include a barrier layer 122. The barrier layer 122 may in an implementation be formed of a dielectric composition that is not a conductor. Each element conductor 106 is in electrical communication with an under-bump metallization pad 124 passing through a hole in the barrier layer 122. As an implementation, the under-bump metallization pads 124 may be mutually separated by an insulating protective layer 126. As an example, each under-bump metallization pad 124 may be in electrical communication with a solder bump 128. It is understood that the solder bump may be formed of a suitable conductor, which may be a solder composition or may be another conductive composition.

FIG. 1 shows the Microelectronic Element Array with DCA Pads 100 after DCA bonding to a substrate 130 forming part of another device with which the Microelectronic Element Array with DCA Pads 100 has been integrated. As examples, the substrate 130 may be a circuit board or another chip substrate. In an implementation, the substrate 130 may include bonding pads 132 formed of a conductor composition, in electrical communication with electrical circuitry within the substrate 130, and in electrical communication with the solder bumps 128 and the under-bump metallization pads 124.

Figure 5:
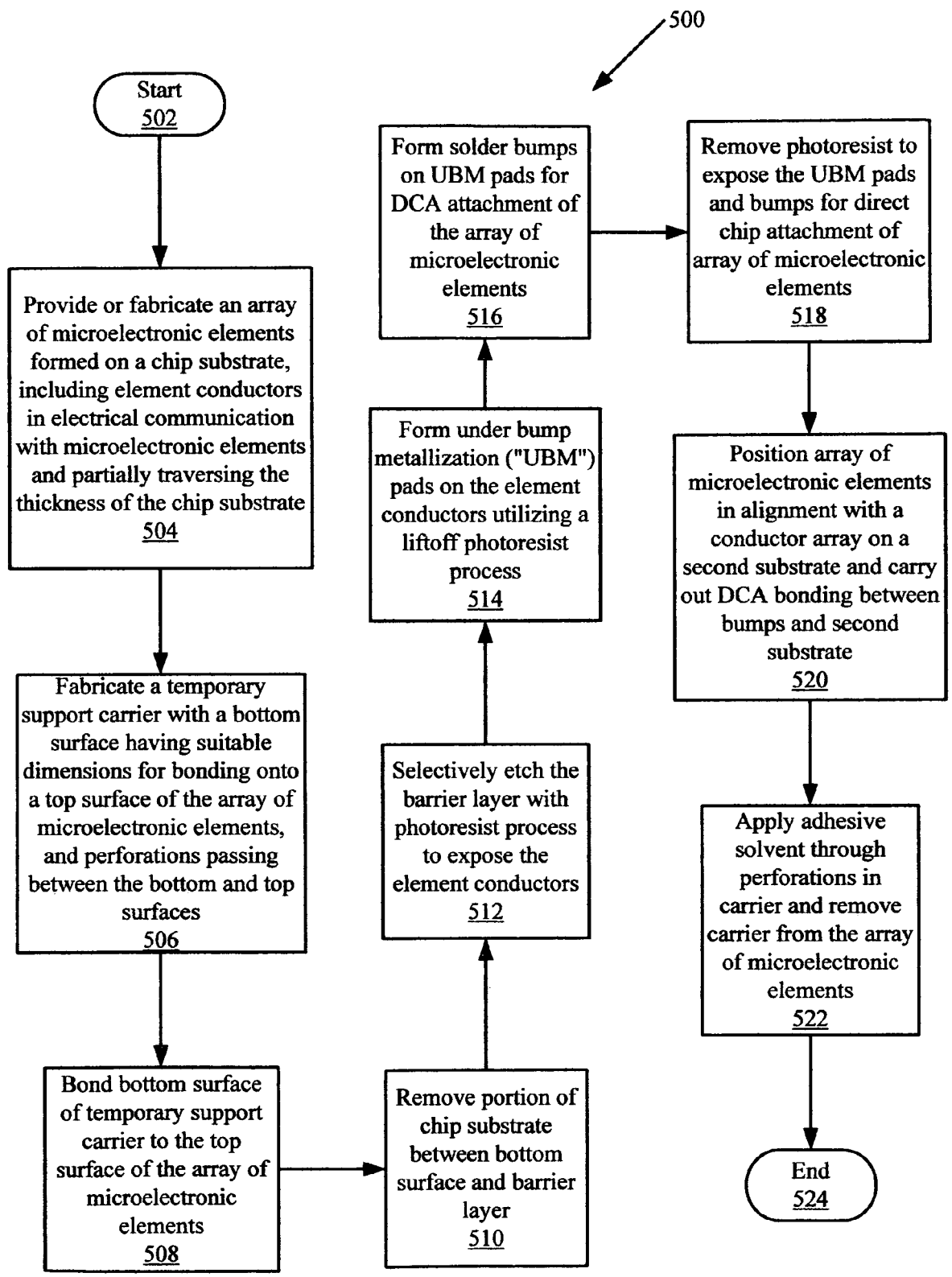
FIG. 5 is a flow-chart showing an example of an implementation of a process for fabricating the Microelectronic Element Array with DCA Pads.
Figure 6:
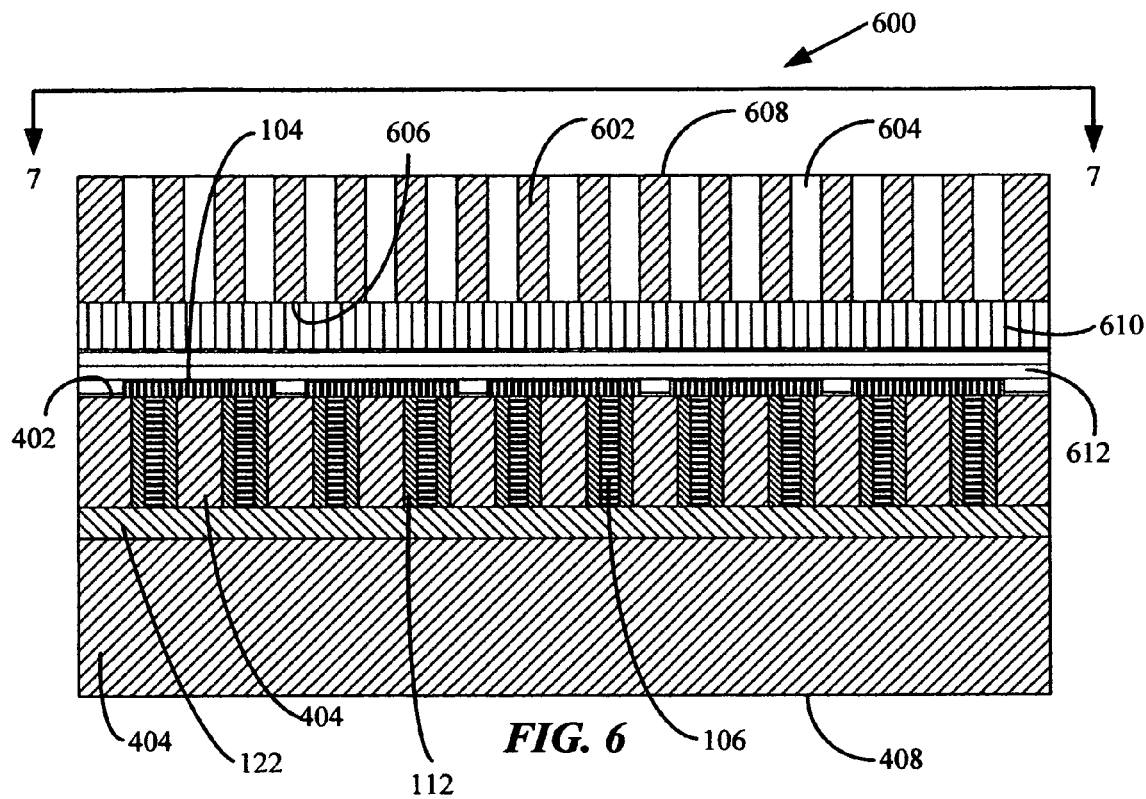
FIG. 6 is a cross-sectional view showing an example of a Microelectronic Element Array with DCA Pads during its fabrication.
Figure 8:
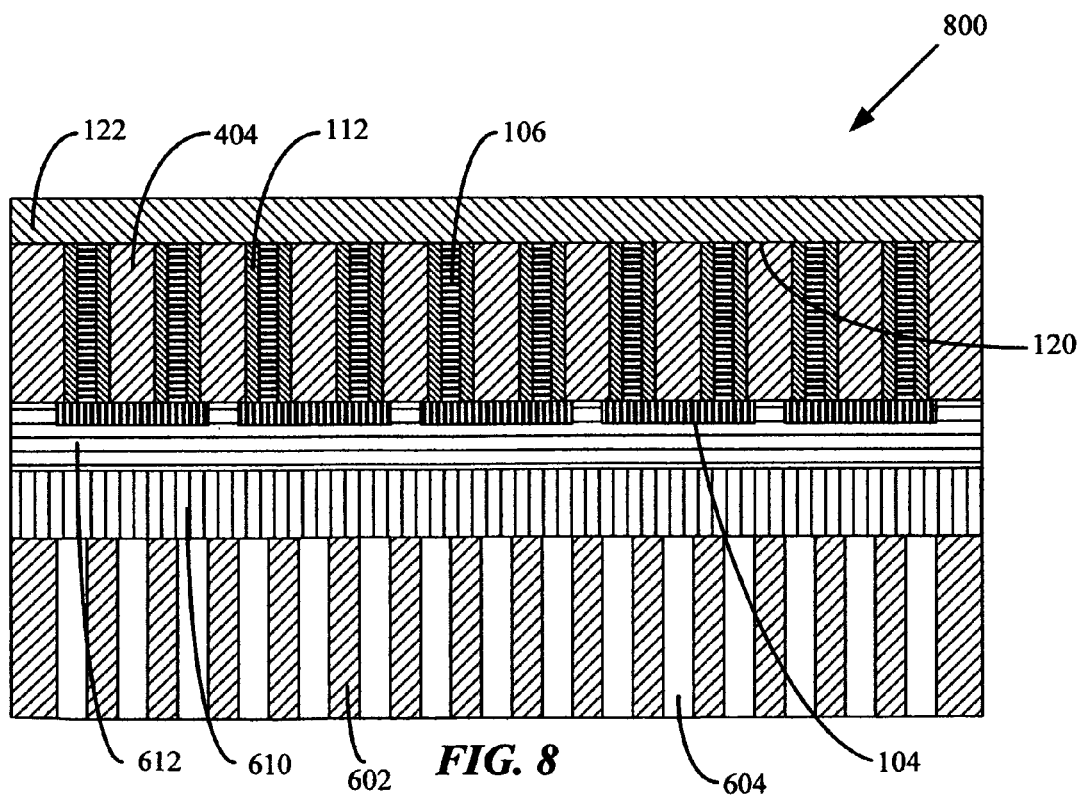
FIG. 8 is a cross-sectional view showing an example of a Microelectronic Element Array with DCA Pads during its fabrication.
Figure 7:
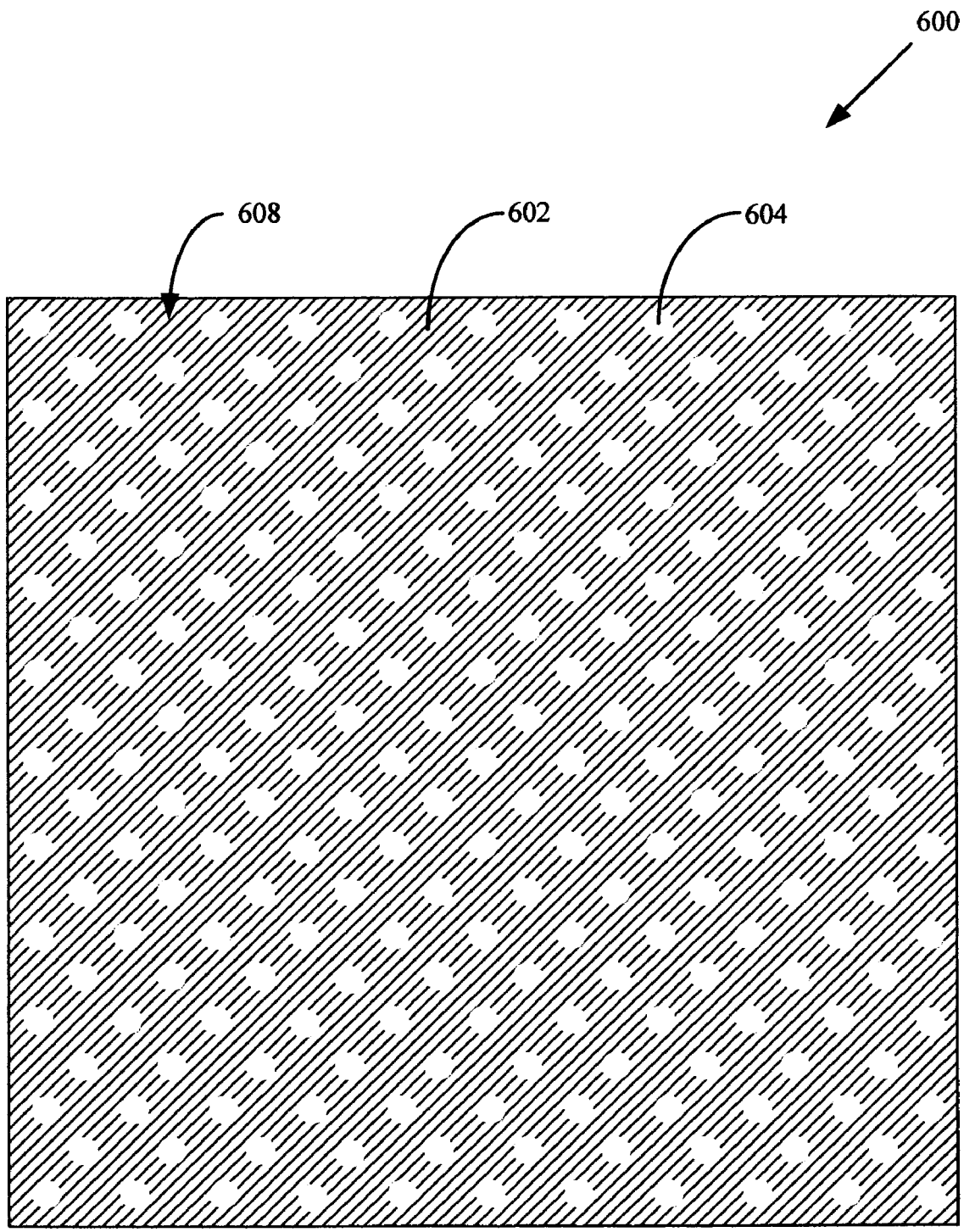
FIG. 7 is a top view of the Microelectronic Element Array with DCA Pads during its fabrication, taken on line 7-7.
Figure 9:
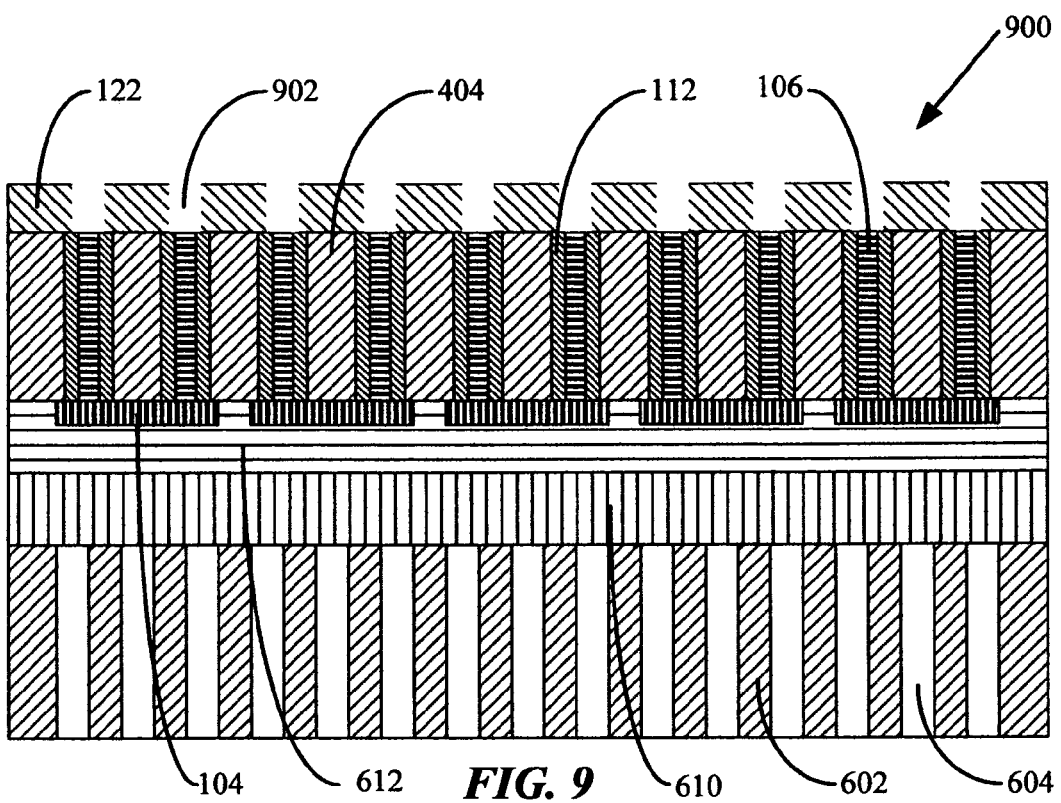
FIG. 9 is a cross-sectional view showing an example of a Microelectronic Element Array with DCA Pads during its fabrication.
Figure 10:
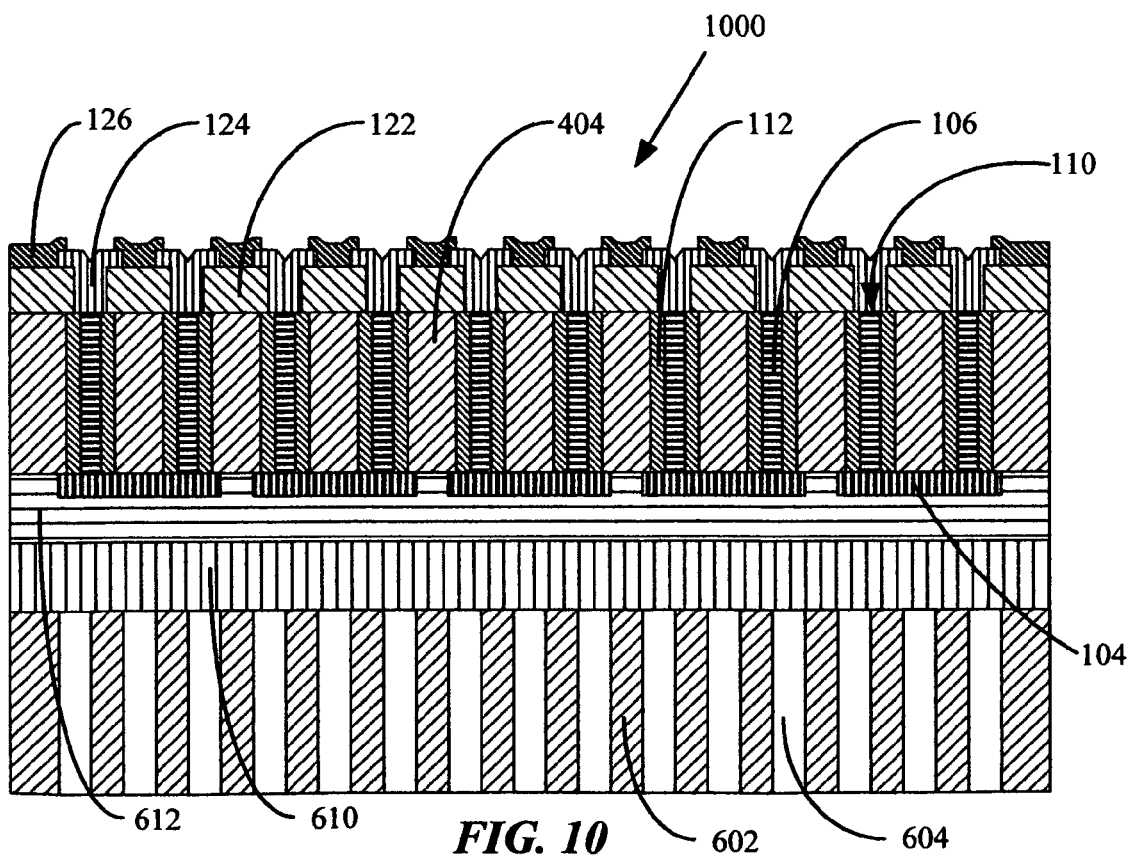
FIG. 10 is a cross-sectional view showing an example of a Microelectronic Element Array with DCA Pads during its fabrication.
Figure 11:
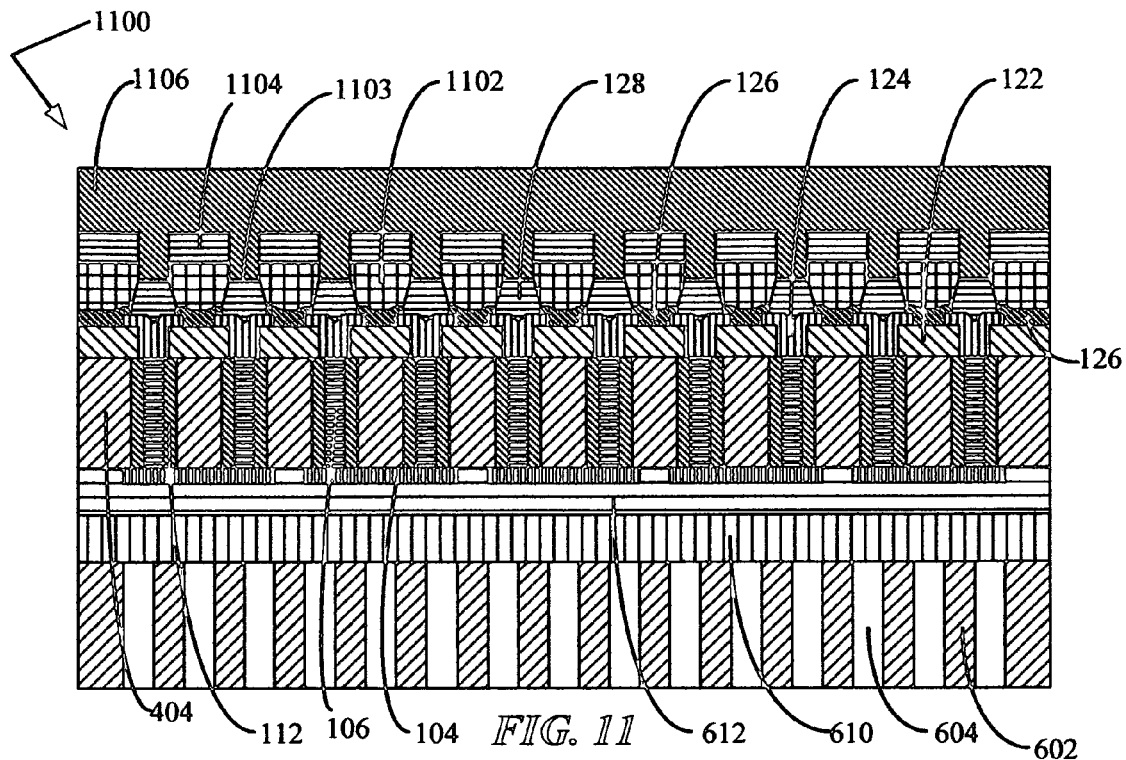
FIG. 11 is a cross-sectional view showing an example of a Microelectronic Element Array with DCA Pads during its fabrication.
Figure 12:
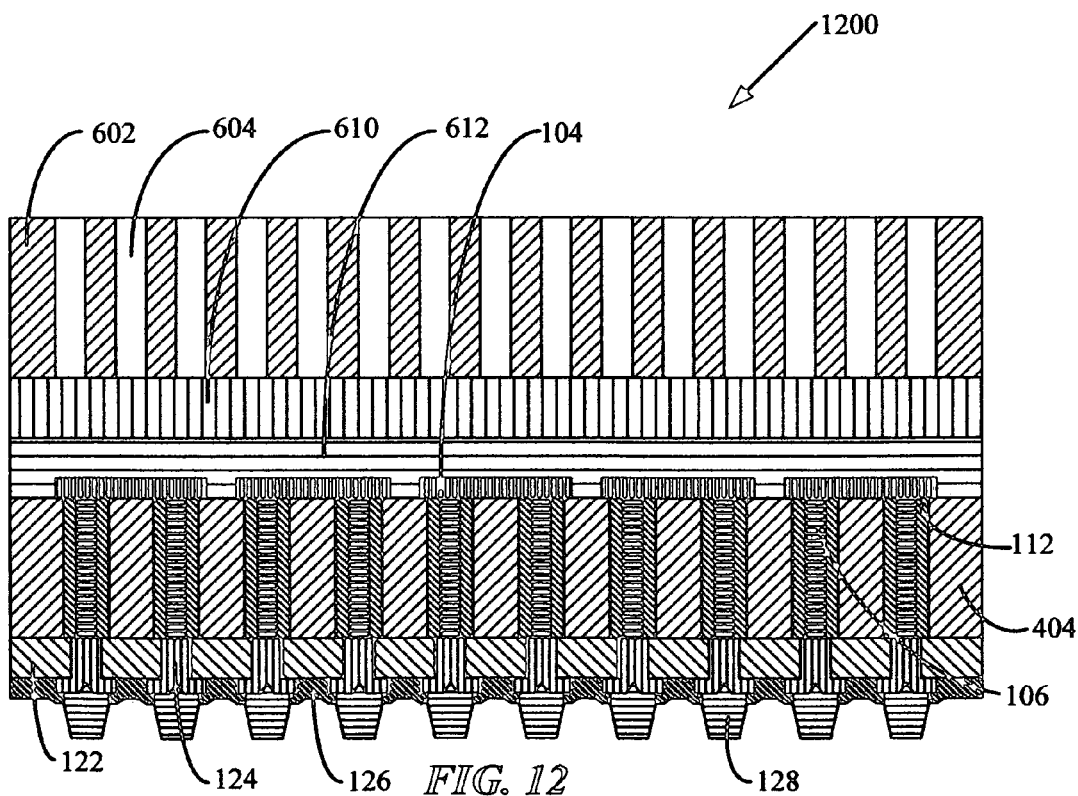
FIG. 12 is a cross-sectional view showing an example of a Microelectronic Element Array with DCA Pads during its fabrication.
Figure 13:
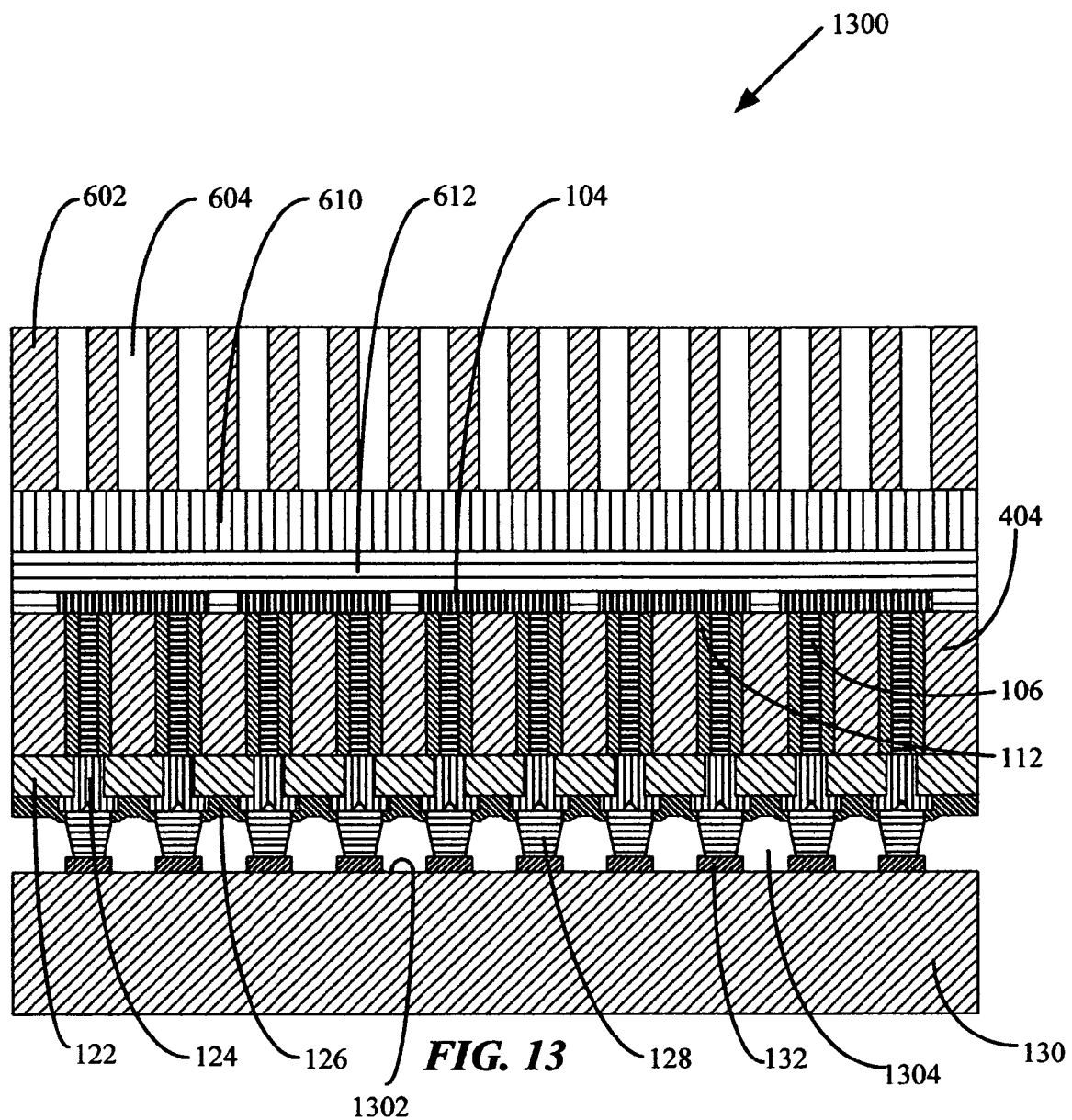
FIG. 13 is a cross-sectional view showing an example of a Microelectronic Element Array with DCA Pads during its fabrication.

FIG. 5 is a flow-chart showing an example of an implementation of a process 500 for fabricating the Microelectronic Element Array with DCA Pads 100. FIG. 6 is a cross-sectional view showing an example of a Microelectronic Element Array with DCA Pads 100 at a stage 600 during its fabrication. FIG. 7 is a top view of the Microelectronic Element Array with DCA Pads 100 at stage 600 of its fabrication taken on line 7-7. FIG. 8 is a cross-sectional view showing an example of a Microelectronic Element Array with DCA Pads 100 at a stage 800 during its fabrication. FIG. 9 is a cross-sectional view showing an example of a Microelectronic Element Array with DCA Pads 100 at a stage 900 during its fabrication. FIG. 10 is a cross-sectional view showing an example of a Microelectronic Element Array with DCA Pads 100 at a stage 1000 during its fabrication. FIG. 11 is a cross-sectional view showing an example of a Microelectronic Element Array with DCA Pads 100 at a stage 1100 during its fabrication. FIG. 12 is a cross-sectional view showing an example of a Microelectronic Element Array with DCA Pads 100 at a stage 1200 during its fabrication. FIG. 13 is a cross-sectional view showing an example of a Microelectronic Element Array with DCA Pads 100 at a stage 1300 during its fabrication.

The process 500 starts at step 502. At step 504, an array 400 of microelectronic elements 104 formed on a typical chip substrate 404, as shown in FIG. 4 and discussed above, may be provided or fabricated. The array 400 of microelectronic elements 104 formed on a chip substrate 404 includes a element conductor 106 in electrical communication with microelectronic elements 104 in the manner as discussed above in connection with FIG. 1. However, the element conductors 106 do not traverse the full thickness of the chip substrate 404 as represented by the arrow 406, but instead terminate at points 110. As an example, a barrier layer 122 may be interposed within the chip substrate 404 at the points 110. In an implementation, the chip substrate 404 is formed of a conductive composition, and the element conductors 106 are surrounded by insulator layers 112 as discussed above in connection with FIG. 1.

In an implementation, the thickness of a chip substrate 404 having a diameter of 200 millimeters, as represented by the arrow 406, may be about 725 micrometers plus or minus about 25 micrometers. It is understood that such a thickness of the chip substrate 404 is merely an example, and arrays 400 of microelectronic elements 104 on chip substrates 404 having other thicknesses may be utilized. The array 400 of microelectronic elements 104 as shown in FIG. 4 may be fabricated utilizing conventional techniques for making such devices on a chip substrate 404. As an example, the array 400 of microelectronic elements 104 formed on a chip substrate 404 may be commercially obtained. In an implementation, an array 400 of microelectronic elements 104 formed on a chip substrate 404 having such a thickness may be selected as a starting material for utilization in the process 500, as the thick chip substrate 404 may provide good mechanical support for the array 400 of microelectronic elements 104 during the initial steps of the process 500 now discussed.

Referring to FIGS. 6 and 7 showing fabrication of a Microelectronic Element Array with DCA Pads 100 at stage 600, at step 506 a temporary support carrier 602 having perforations 604 is provided or fabricated. The temporary support carrier 602 includes a bottom surface 606 having suitable dimensions selected for bonding onto the top surface 402 of the array 400 of microelectronic elements 104. The temporary support carrier further includes a top surface 608 opposite the bottom surface 606. The perforations 604 reach both the bottom and top surfaces 606 and 608, respectively.

At step 508, the bottom surface 606 of the temporary support carrier 602 is bonded onto the top surface 402 of the array 400 of microelectronic elements 104. In an implementation, a layer 610 of an adhesive composition may be interposed between the top surface 402 of the array 400 and the bottom surface 606 of the temporary support carrier 602 to form a bond. As an example, an adhesive composition suitable for subsequent dissolution by a solvent composition compatible with the array 400 of microelectronic elements 104 may be selected. By "compatible" is meant throughout this specification that the solvent composition will not cause any significant damage to the array 400. The perforations 604 facilitate introduction of such a solvent composition to portions of the layer 610 that are exposed by the perforations 604 and are covered by the adhesive composition, in order to dissolve the adhesive as discussed further below. As an example, a protective passivation layer 612 may be formed on the top surface 402 of the array 400 before application of the layer 610 of an adhesive composition. Such a protective passivation layer 612 may protect the array 400 of microelectronic elements 104 from contamination or other damage by the layer 610 of an adhesive composition. In an implementation, the protective passivation layer 612 is formed of a composition suitable for subsequent removal as discussed below. As examples, the passivation layer may include silicon dioxide or silicon nitride or a mixture.

Referring to FIG. 8 showing fabrication of a Microelectronic Element Array with DCA Pads 100 at stage 800, at step 510 the bottom surface 408 of the chip substrate 404 as shown in FIG. 6 is removed to expose the barrier layer 122. As an example, the portion of the chip substrate 404 between the barrier layer 122 and the bottom surface 408 may be removed by a series of steps including backgrinding, polishing, and etching to the barrier layer 122. In an implementation, the barrier layer 122 is formed of a composition including silicon dioxide, the chip substrate 404 is formed of a composition including silicon, and a wet etching composition that erodes silicon dioxide more slowly than it erodes silicon is selected. In another implementation, the barrier layer 122 may be omitted, and an etching process may be carried out over a controlled time period to stop at the bottom surface 120.

Referring to FIG. 9 showing fabrication of a Microelectronic Element Array with DCA Pads 100 at stage 900, at step 512 the barrier layer 122 may be selectively etched to expose the element conductors 106 that are in contact with the barrier layer 122. As an example, a photoresist may be applied onto the barrier layer 122, and exposed to light through a mask configured to enable subsequent removal of those portions of the photoresist overlying the element conductors 106. A suitable etching composition may then be applied onto the photoresist for selective removal of the exposed regions of the barrier layer 122, leaving holes 902 in the barrier layer 122.

Referring to FIG. 10 showing fabrication of a Microelectronic Element Array with DCA Pads 100 at stage 1000, at step 514 an array of under bump metallization ("UBM") pads 124 are formed in electrical communication with the element conductors 106 at the points 110. As an example, the UBM pads 124 may be formed by multiple cycles of a liftoff photoresist process with successive application of metallization layers. In an implementation, the UBM pads 124 may include one or more types of layers successively applied onto the element conductors 106, including adhesion, diffusion barrier, solder bump wetting, and oxidation-protective layers. An adhesion layer may be applied to the element conductors 106 to facilitate adhesion of subsequently applied layers. A diffusion barrier layer may then be applied to reduce migration of a solder composition, discussed below, into the element conductors 106. A solder wetting layer may then be applied to facilitate wetting of the UBM pads 124 by solder bumps 128 discussed below. An oxidation-protective layer may then be applied to reduce oxidation of the UBM pads 124. It is understood that each of the adhesion, diffusion barrier, solder bump wetting, and oxidation-protective layers may be formed by multiple cycles of a liftoff photoresist process, and that one or more of such layers may be omitted or applied in a different order. After completion of the liftoff photoresist process, portions of the photoresist composition may be left behind on the barrier layer 122 surrounding the UBM pads 124. In an implementation, these portions of the photoresist composition may be retained on the barrier layer 122, forming an insulating layer 126 between the UBM pads 124.

In an implementation (not shown), step 514 may include the formation of lateral conductors on the barrier layer 122 in electrical communication with the element conductors 106, in order to transform the array of element conductors 106 as shown in FIG. 3 into a different array layout selected for compatibility with an array of bonding pads 132 on a substrate 130 forming part of another device with which the Microelectronic Element Array with DCA Pads 100 is to be been integrated. As an example, a layer of a conductive composition may be applied onto the barrier layer 122. The layer of conductive composition may then be patterned by application and lithographic exposure of a photoresist followed by etching of the regions unprotected by the photoresist, leaving behind lateral conductors on the surface of the barrier layer 122 each in electrical communication with an element conductor at a point 120. The lateral conductors, as an example in the form of wires, may then be covered by an insulating layer. The insulating layer may then be selectively removed forming vias in communication with exposed ends of the lateral conductors distal to the element conductors 106. The vias may then be filled with a conductive composition to form conductors arranged in a selected transformed array. The above-discussed aspects of step 514 earlier discussed and shown in FIG. 10 may then be carried out.

Referring to FIG. 11 showing fabrication of a Microelectronic Element Array with DCA Pads 100 at stage 1100, at step 516 an array of solder bumps 128 may be formed on the UBM pads 124. As an implementation, the solder bumps 128 may be formed by a liftoff photoresist process as earlier discussed. In examples, the solder bumps 128 may be formed of a conductor composition including tin, indium, or a mixture. Referring to FIG. 11, the photoresist layer 1102 may form wells into which the composition utilized for forming the solder bumps 128 may drop down and penetrate. As an implementation, the photoresist layer 1102 may form wells having walls that taper to a smallest width where ends 1103 of the solder bumps 128 will be formed. Portions 1104 of a conductor composition utilized for forming the solder bumps 128 may be deposited on the photoresist layer 1102. The portions 1104 of the conductor composition may be subsequently removed along with the photoresist layer 1102, due to differences in height of the solder bumps 128 and portions 1104 of the conductor composition on the photoresist layer 1102. As an example, the photoresist layer 1102 may be temporarily left on the insulating protective layer 126 to protect the solder bumps 128 and UBM pads 124 from damage. In another implementation, an additional protective layer 1106 may be applied onto the solder bumps 128, the portions 1104 of the conductor composition and the photoresist layer 1102 to further protect the solder bumps and the UBM pads 124 from damage. As an example, the protective layer 1106 may be formed of a photoresist composition.

In an implementation, step 516 may include dicing multiple arrays 400 of microelectronic elements 104, as formed on a single wafer. As an example, dicing may be carried out after formation of the solder bumps 128. In an implementation, dicing may be carried out prior to removal of the photoresist layer 1102. As another example, the protective layer 1106 may be applied prior to dicing. The photoresist layer 1102 and the protective layer 1106 may protect the arrays 400 of microelectronic elements 104 from contamination by wafer debris and other damage during dicing.

Referring to FIG. 12 showing fabrication of a Microelectronic Element Array with DCA Pads 100 at stage 1200, at step 518 the photoresist layer 1102 and the portions 1104 of the conductor composition may be removed to expose the UBM pads 124 and the solder bumps 128 for DCA bonding onto a second substrate 130. The photoresist layer 1106, if present, may be removed at the same time. In an implementation, the temporary support carrier 602 may remain bonded at stage 1200 onto the top surface 402 of the array 400 of microelectronic elements 104. In an example, removal of the temporary support carrier 602 from the array 400 of microelectronic elements 104 prior to bonding of the array 400 onto a second substrate 130 may result in deformation or breakage of the array 400 due to inadequate mechanical strength of the chip substrate 404.

Referring to FIG. 13 showing fabrication of a Microelectronic Element Array with DCA Pads 100 at stage 1300, at step 520 the array 400 of microelectronic elements 104 is positioned on a second substrate 130 for DCA bonding of the array of UBM pads 124 and solder bumps 128 onto and in alignment with an array of conductors on the surface 1302 of the second substrate 130. As an example, the second substrate 130 may include an array of bonding pads 132 formed of a conductor composition. In an implementation, bonding may be carried out by applying heat at a controlled temperature tolerable by the array 400 and the second substrate 130. Pressure between the solder bumps 128 and the bonding pads 132 may, as an example, be applied. In an implementation, the solder bumps 128 may then be subjected to a reflow process. As an example, spaces 1304 between the array 400 and the second substrate 130 may be underfilled with an insulating composition. In an implementation, care is taken in such underfilling so that the temporary support carrier 602 and the microelectronic elements 104 are not contaminated by the insulating composition. As an example, the insulating composition may include silicon nitride. In another implementation, dicing of a wafer including multiple arrays 400 of microelectronic elements 104 is delayed until after completion of step 520.

Referring to FIG. 13, at step 522 the temporary support carrier 602 may then be removed, yielding the Microelectronic Element Array with DCA Pads 100 DCA bonded onto the second substrate 130. In an implementation, a solvent for the adhesive layer 610 may be applied to the perforations 604 and the temporary support carrier 602 may then be removed. In an implementation where a protective passivation layer 612 is present, it may then be suitably removed. The process 500 then ends at step 524.

It will be understood that the foregoing description of numerous implementations has been presented for purposes of illustration and description. As an example, modifications may be made in the structures of the Microelectronic Element Arrays with DCA Pads 100 while providing the UBM pads and a chip substrate with a reduced path length of element conductors through the chip substrate for DCA bonding. This description is not exhaustive and does not limit the claimed invention to the precise forms disclosed. Modifications and variations are possible in light of the above description or may be acquired from practicing the invention. The claims and their equivalents define the scope of the invention.

What is claimed is:

1. A process, comprising:
    providing an apparatus including a chip substrate having a first chip surface, an array of sensors or optoelectronic devices being on the first chip surface, and an array of conductors, each of the conductors being located within the chip substrate and having a first end located at the first chip surface, each of the first ends of the conductors being in direct physical contact at the first chip surface with one of the sensors or optoelectronic devices, and each of the conductors having a second end buried within the chip substrate;
    providing a temporary support carrier having a first carrier surface, a second carrier surface facing away from the first carrier surface, and an array of perforations each reaching both of the first and second carrier surfaces;
    bonding the first carrier surface of the temporary support carrier onto the array of sensors or optoelectronic devices;
    removing a portion of the chip substrate, thereby forming a second chip surface facing away from the first chip surface and exposing the second ends of the conductors through the second chip surface; and
    forming a plurality of direct chip attachment pads at the second chip surface, wherein each of the direct chip attachment pads is in communication with the second end of one of the conductors.

2. The process of claim 1, wherein the providing an apparatus includes providing a barrier layer in contact with the second ends of the conductors.

3. The process of claim 2, wherein the exposing the second ends of the conductors includes selectively etching the barrier layer at the second chip surface.

4. The process of claim 1 wherein the forming a plurality of direct chip attachment pads includes forming under bump metallization pads at the second chip surface, each of the under bump metallization pads being in direct physical contact with the second end of one of the conductors.

5. The process of claim 4 wherein the forming a plurality of direct chip attachment pads includes forming solder bumps being in direct physical contact with the under bump metallization pads.

6. The process of claim 4 wherein the forming a plurality of direct chip attachment pads includes covering each of the under bump metallization pads with a protective layer.

7. The process of claim 6 wherein the forming a plurality of direct chip attachment pads includes dicing the chip substrate while the under bump metallization pads are covered with the protective layer.

8. The process of claim 1, wherein the process includes bonding the direct chip attachment pads onto another substrate while the temporary support carrier is bonded onto the array of sensors or optoelectronic devices.

9. The process of claim 8, wherein the process includes debonding the temporary support carrier from the array of sensors or optoelectronic devices after completing the bonding of the direct chip attachment pads onto the another substrate.

10. The process of claim 2, wherein the providing an apparatus includes forming lateral wires on the barrier layer transforming the array of conductors into a different array of conductors.

11. The process of claim 1 wherein the bonding the first carrier surface of the temporary support carrier onto the array of sensors or optoelectronic devices includes interposing an adhesive composition layer between the first carrier surface and the array of sensors or optoelectronic devices.

12. The process of claim 11, wherein the process includes debonding the temporary support carrier from the array of sensors or optoelectronic devices by applying a solvent to the adhesive composition layer through the perforations.

13. The process of claim 9 wherein the bonding the first carrier surface of the temporary support carrier onto the array of sensors or optoelectronic devices includes interposing an adhesive composition layer between the first carrier surface and the array of sensors or optoelectronic devices.

14. The process of claim 13, wherein the process includes debonding the temporary support carrier from the array of sensors or optoelectronic devices by applying a solvent to the adhesive composition layer through the perforations.

15. The process of claim 1, wherein the providing an apparatus includes providing each of the conductors as extending within the chip substrate in one direction to the first end of the conductor, and includes proving each of the conductors as extending within the chip substrate in another direction, being opposite to the direction, to the second end of the conductor.

16. The process of claim 1, wherein the removing a portion of the chip substrate includes reducing an average thickness between the first and second chip surfaces of the chip substrate to less than about 100 micrometers.

17. The process of claim 1, wherein the providing an apparatus includes providing the array of sensors or optoelectronic devices as including an array of sensors.

18. The process of claim 1, wherein the providing an apparatus includes providing the array of sensors or optoelectronic devices as including an array of optoelectronic devices.

19. The process of claim 18, wherein the providing an apparatus includes providing the array of optoelectronic devices as including an array of micro-electro-mechanical systems.

20. The process of claim 19, wherein the providing an apparatus includes providing the array of micro-electro-mechanical systems as including sensors or optical elements.

21. The process of claim 1, wherein the providing an apparatus includes providing the array of conductors as being buried within the chip substrate.

22. The process of claim 1, wherein the providing an apparatus includes providing the array of conductors as being buried within the chip substrate; and wherein the forming a plurality of direct chip attachment pads includes forming each of the direct chip attachment pads as being in direct physical contact with the second end of one of the conductors.

* * * * *